United States Patent
Zerod et al.

(10) Patent No.: US 6,978,117 B2
(45) Date of Patent: Dec. 20, 2005

(54) RF AGC AMPLIFIER SYSTEM FOR SATELLITE/TERRESTRIAL RADIO RECEIVER

(75) Inventors: Richard D. Zerod, Livonia, MI (US); Jack H. King, Howell, MI (US)

(73) Assignee: Visteon Global Technologies, Inc., Van Buren Township, MI (US)

( * ) Notice: Subject to any disclaimer, the term of this patent is extended or adjusted under 35 U.S.C. 154(b) by 488 days.

(21) Appl. No.: 10/106,010

(22) Filed: Mar. 25, 2002

(65) Prior Publication Data

US 2003/0181178 A1 Sep. 25, 2003

(51) Int. Cl.[7] .......................... H04B 1/10; H04B 17/00
(52) U.S. Cl. ................. 455/3.02; 455/63.1; 455/226.3; 455/249.1
(58) Field of Search .......................... 455/234.1, 232.1, 455/12.1, 234.2, 241.1, 249.1, 245.1, 250.1, 455/226.3, 3.02, 63.1, 220, 226.1, 222, 296, 455/340, 240.1

(56) References Cited

U.S. PATENT DOCUMENTS

| | | | | |
|---|---|---|---|---|
| 5,758,271 A | * | 5/1998 | Rich et al. ............... | 455/234.1 |
| 6,009,307 A | * | 12/1999 | Granata et al. ........... | 455/13.3 |
| 6,044,253 A | * | 3/2000 | Tsumura ................... | 455/234.1 |
| 6,052,566 A | * | 4/2000 | Abramsky et al. ........ | 455/67.11 |
| 6,072,998 A | * | 6/2000 | Kaku ....................... | 455/234.2 |
| 6,134,430 A | * | 10/2000 | Younis et al. ............... | 455/340 |
| 6,208,849 B1 | * | 3/2001 | Cho et al. .................... | 455/296 |
| 6,282,252 B1 | * | 8/2001 | Fushimi ..................... | 375/346 |
| 6,498,926 B1 | * | 12/2002 | Ciccarelli et al. ........ | 455/240.1 |

* cited by examiner

*Primary Examiner*—Simon Nguyen
(74) *Attorney, Agent, or Firm*—MacMillan, Sobanski & Todd LLC

(57) ABSTRACT

Saturation of an RF front end in a radio receiver is prevented when receiving a desired radio broadcast signal via an antenna in the presence of a strong, undesired radio broadcast signal within a passband of the RF front end. An antenna signal from the antenna is coupled to the RF front end, thereby generating an amplified signal. The radio receiver demodulates the desired radio broadcast signal in response to the amplified signal, thereby generating a demodulated signal. A signal-to-noise quality parameter of the demodulated signal is determined. The antenna signal is attenuated prior to coupling it to the RF front end by an attenuation determined in response to the signal-to-noise quality parameter.

13 Claims, 6 Drawing Sheets

RF AGC AMPLIFIER SYSTEM FOR SATELLITE/TERRESTRIAL RADIO RECEIVER

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to radio reception of a relatively weak desired signal in the presence of a relatively strong undesired signal at a nearby frequency, and, more specifically, to controlling a front-end attenuator to maximize a back-end signal-to-noise ratio to thereby prevent overloading of a front-end amplifier by the strong undesired signal.

In a heterodyne radio receiver, it is well known that a front-end radio frequency (RF) stage typically has a passband significantly greater than the bandwidth of the desired signal. Especially at high frequencies, it is difficult and expensive to filter out undesired signals. Therefore, filtering to select only the desired signal is usually performed in a subsequent intermediate frequency (IF) stage and/or at baseband.

Due to the low voltage levels of an antenna signal, the RF front end includes one or more stages of RF amplification. There may be an initial stage providing a fixed gain, for example. To ensure that an RF signal of appropriate magnitude is provided by the RF stage to the subsequent IF stage, an automatic gain control (AGC) loop is typically connected to a variable-gain RF amplifier for at least one stage of RF amplification. The amplifier AGC control optimizes the overall level within the RF amplifier passband (i.e., the AGC cannot optimize the RF level of the desired signal individually). When receiving a relatively weak, desired radio signal in the presence of a relatively strong, undesired signal at a nearby frequency (e.g., an adjacent channel or an alternate channel), interference with the desired signal may greatly degrade the reception quality of the desired signal. An especially strong signal can also saturate or overload one or more RF amplifier stages so that a desired signal may be completely lost.

The foregoing problem can be particularly acute in the context of a radio receiver for the satellite digital audio radio service (S-DARS) which utilizes a combination of satellite transmitters and terrestrial repeaters. The terrestrial repeaters fill in gaps where reception from the satellites is reduced (such as in an urban area where the receiver is shielded from the satellites by buildings). Two S-DARS broadcast systems are currently licensed for operation in the United States. Both the satellite and terrestrial transmissions of these services are contained within an allocated spectrum of 2320 to 2345 MHz. The satellite and terrestrial signals of each particular service are broadcast at distinct frequencies within this band.

In general, the magnitude of the received signal strength for the satellite signal is relatively modest but does not vary greatly as long as the path to the satellite is unobstructed. On the other hand, the received signal strength for the repeater signal varies greatly between very large and zero depending upon the distance of the nearest terrestrial broadcast tower.

An S-DARS receiver typically uses two separate antennas, one for reception of the satellite signals and one for reception of the terrestrial signals. Both antennas may be physically packaged together in a common mechanical housing for ease of installation in an automobile, for example. The satellite and terrestrial signals are processed in two separate signal paths in the receiver front-end circuitry. The separate signals are demodulated separately at the receiver back-end and are then combined in a known manner to achieve a best overall signal reproduction, such as in a maximum ratio combiner.

Due to the differences in elevation of the normal lines of sight to the satellites and the terrestrial repeaters, the separate antennas typically have different reception patterns. The satellite antenna has its greatest gain with respect to RF signals arriving from a high elevation, while the terrestrial antenna has its greatest gain with respect to RF signals arriving from a lower elevation. Each antenna signal is typically fed to an RF front end including a respective variable gain RF amplifier for each signal. Since the satellite signals generally have a relatively lower average signal strength, the RF amplifier in the satellite signal path may typically be provided with a relatively greater overall gain capacity than in the terrestrial path.

A disadvantage of the foregoing S-DARS system is that a significant amount of signal from the terrestrial repeaters can potentially appear at the output of the satellite antenna. For example, repeaters may be deployed at the tops of buildings so that an automobile near the building may have its satellite antenna oriented with its greatest sensitivity pointed toward the terrestrial antenna. Due to the close proximity to the repeater, the signal strength of any undesired signals from the repeater that are picked up by the satellite antenna can easily be much greater than the expected signal strength for which the satellite signal path was designed.

Terrestrial repeaters of the two S-DARS systems are not typically located near one another. Consequently, when a receiver of one system is close to a terrestrial repeater of the other system then it is primarily depending upon a satellite for reception of its desired system. In that case, the stronger, undesired signal from the repeater may impede reception of the desired signal from the satellite. If the amount of the unwanted repeater signal is large enough (as in the case where the vehicle is very near an interfering terrestrial repeater tower), it can potentially drive the front-end circuitry of the satellite receiver path into non-linear operation (i.e., saturation). When this occurs, the signal-to-noise ratio of the received satellite signal greatly decreases and satellite reception may be totally lost.

In order to minimize saturation in the satellite signal path, a certain amount of attenuation can be added to the satellite signal path. Previously, a variable attenuator at the input of the satellite signal path and driving a fixed gain RF amplifier has been controlled in a manner to limit RF amplifier output voltage. Although some improvement is obtained, there continue to be numerous occurrences wherein the satellite signals are lost or greatly distorted. Furthermore, circuitry to measure and limit the RF amplifier voltage adds expense to the receiver.

SUMMARY OF THE INVENTION

The present invention has the advantages of improving reception of satellite signals in the face of strong undesired signals being received by the satellite antenna.

In one primary aspect of the invention, a method is provided for preventing saturation of an RF front end in a radio receiver when receiving a desired radio broadcast signal via an antenna in the presence of an undesired radio broadcast signal within a passband of the RF front end. An antenna signal from the antenna is coupled to the RF front end, thereby generating an amplified signal. The radio receiver demodulates the desired radio broadcast signal in response to the amplified signal, thereby generating a demodulated signal. A signal-to-noise quality parameter of the demodulated signal is determined. The antenna signal is attenuated prior to coupling it to the RF front end by an attenuation determined in response to the signal-to-noise quality parameter.

DETAILED DESCRIPTION OF PREFERRED EMBODIMENTS

Figure 1:
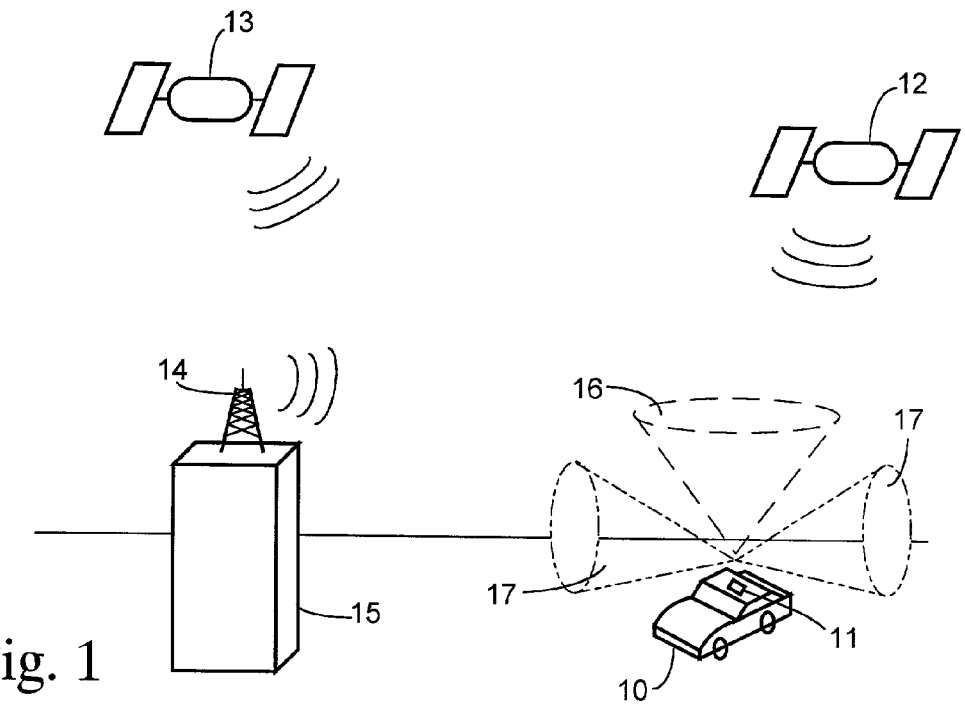
FIG. 1 depicts an S-DARS system architecture.

Referring to FIG. 1, a vehicle 10 having a satellite radio receiver, such as an S-DARS receiver, employs an antenna module 11 for receiving satellite and terrestrial RF broadcast signals. Satellites 12 and 13 broadcast identical programming in respective frequency slots assigned to the satellite radio service. A terrestrial tower 14 is installed on a building 15 for broadcasting in an S-DARS service as a gap filler where satellite reception may be degraded. If in the same S-DARS service as the one being broadcast by satellites 12 and 13, then the signal broadcast by tower 14 contains identical programming. If belonging to the other S-DARS service, then the tower signal is uncorrelated with the satellite signals.

Antenna module 11 includes a satellite antenna having a reception pattern 16 generally oriented vertically (i.e., having its highest gain in the direction toward the locations of satellites 12 and 13). Antenna module 11 also includes a terrestrial antenna for receiving the terrestrial signals and having a reception pattern 17 generally oriented horizontally (i.e., having its highest gain in the direction toward tower 14).

Generally, the satellite and terrestrial signals can be separately received with a high degree of isolation between the signals since the satellite antenna is not sensitive to signals arriving from the direction of tower 14. As vehicle 10 approaches building 15, however, the actual direction to tower 14 can become nearly vertical. Thus, the satellite antenna can pick up significant amounts of RF energy from terrestrial tower 14. Since the RF gain of the satellite signal chain is optimized for the relatively lower power received in the satellite broadcasts, the relatively strong signals from tower 14 can overload the RF amplifier in the satellite signal chain.

Figure 2:
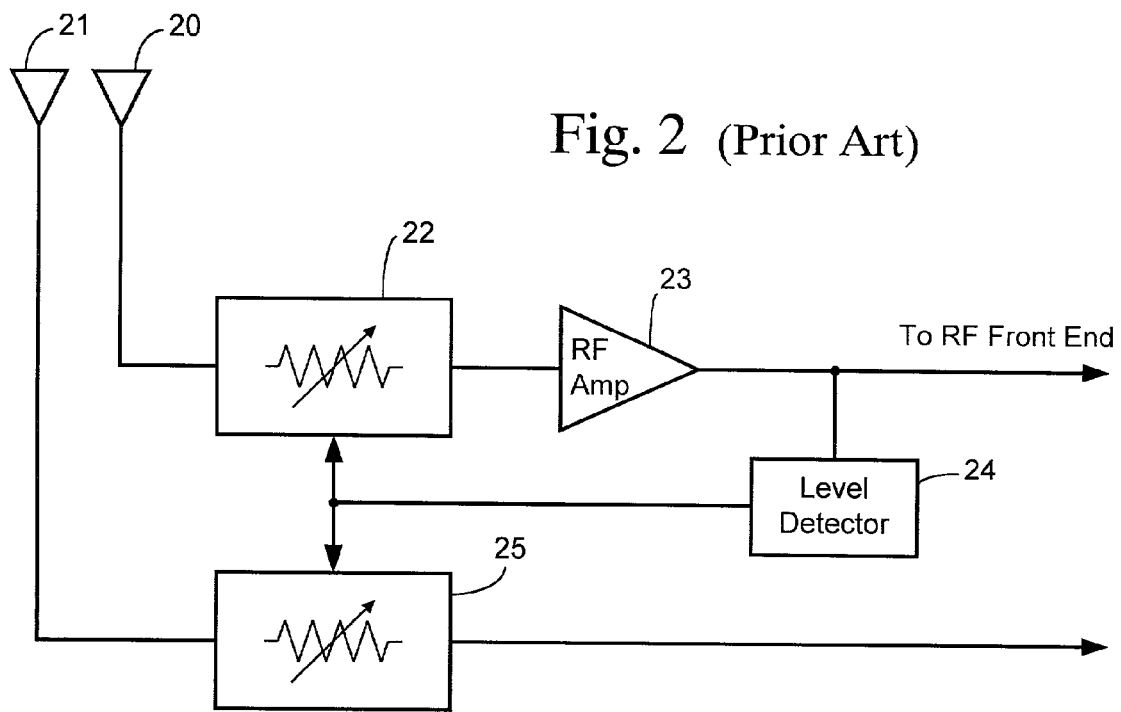
FIG. 2 is a block diagram showing front-end attenuation for reducing overload in a satellite receiver.

FIG. 2 shows an attenuator intended to avoid saturation of the RF amplifier for a satellite signal. A satellite antenna element 20 and a terrestrial antenna element 21 feed attenuators 22 and 25, respectively. The output of attenuator 22 is coupled to a fixed gain RF amplifier 23, the output of which is coupled for further amplification and processing in the RF front end. The output of RF amplifier 23 is also coupled to a level detector 24 which measures the signal level and uses the measured magnitude to control attenuators 22 and 25. Thus, an average RF voltage level of the output of amplifier 23 can be kept to below a selected voltage. Nevertheless, it has been found that amplifier saturation still occurs under certain conditions, resulting in distorted or lost satellite reception. Furthermore, level detector integrated circuit components are relatively expensive and many of the presently available IC's are not qualified for operation in an automotive environment where many S-DARS receivers are used.

Figure 3:
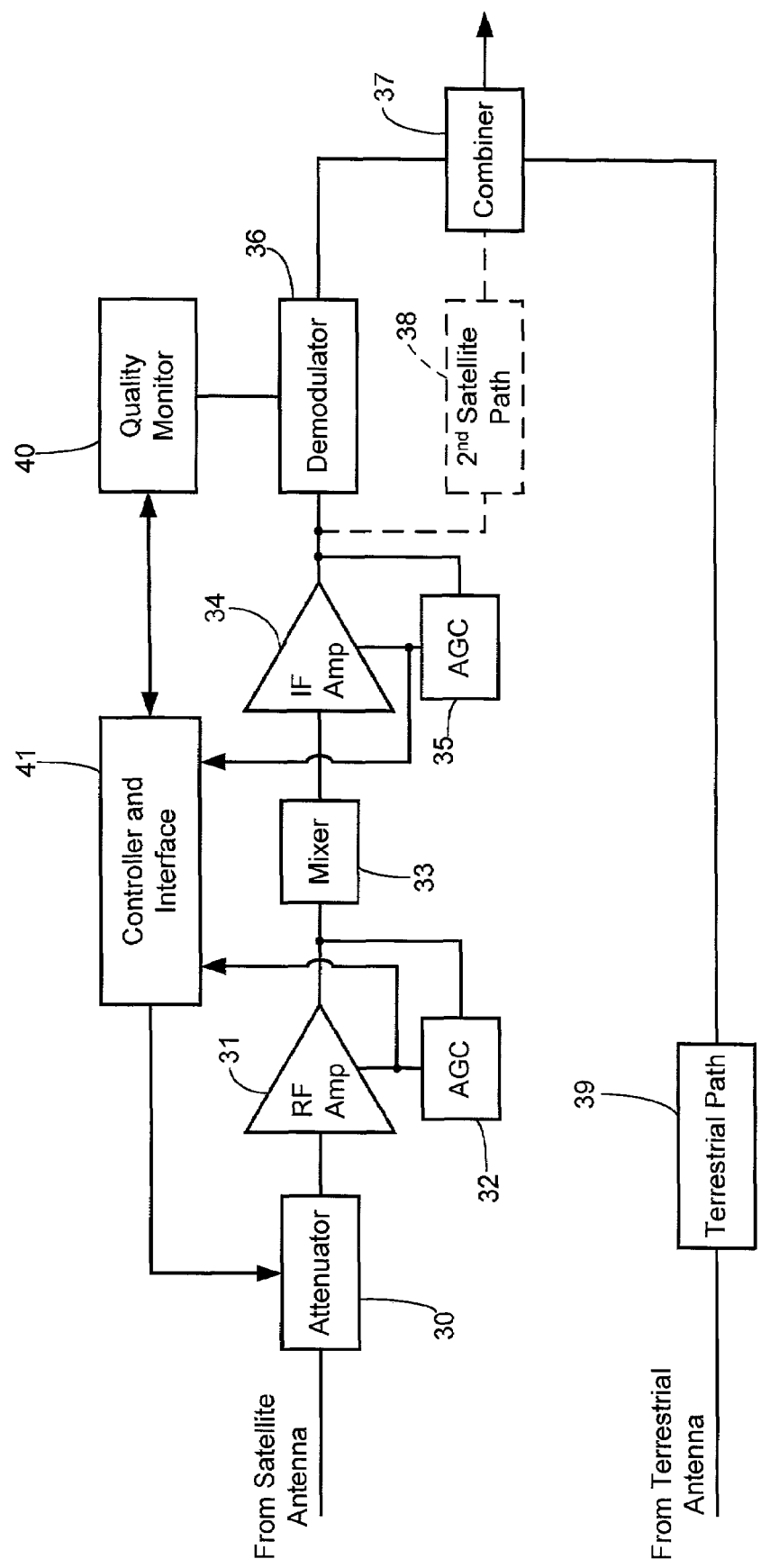
FIG. 3 is a block diagram of portions of an S-DARS radio receiver of the present invention.

FIG. 3 shows an improved receiver for avoiding saturation of the RF amplifier stages while decreasing cost and improving reception under all signal conditions. Satellite antenna signals are coupled through an attenuator 30 to an RF amplifier 31. A range of attenuation of about −30 dB may be provided. An integrated circuit such as the AT-119 voltage variable absorptive attenuator available from M/A-COM, Inc., can be utilized.

More than a single stage of RF amplification may be used, but at least one stage preferably provides automatic gain control (AGC) as is known in the art. Thus, an AGC control block 32 is coupled to RF amplifier 31 to provide a substantially constant output level from RF amplifier 31. If a fixed gain RF amplifier is driven by the output of attenuator 30, then a gain of about +8 dB (and an output compression point, P1 dB, of at least 0 dBm) should be provided. If gain of the fixed RF amplifier exceeds about +8 dB then a fixed attenuator at the output of the RF amplifier may be provided.

The variable gain can alternatively be controlled by signal processing further down the signal chain, such as in the IF section of the receiver or in the demodulator.

The amplified RF signal from amplifier 31 is mixed down to an intermediate frequency (IF) in a mixer 33. The IF signal is amplified by an IF amplifier 34 in conjunction with an IF AGC block 35. After being digitized in an A/D converter and having its frequency down-converted in a digital downconverter (not shown), the IF signal is then demodulated in a demodulator 36. The demodulated signal preferably includes a digital audio signal and auxiliary digital information (e.g., song titles) broadcast by the service provider. The demodulated signal from this satellite path is coupled to one input of a combiner 37 for combining with the outputs of redundant signal paths in order to increase the probability of receiving an acceptable S-DARS signal at all times. Thus, a second satellite signal (e.g., broadcast on a separate frequency within the allocated frequency band) may be separated out by the digital downconverter into a second satellite path 38. The second satellite signal is demodulated and provided to combiner 37. Likewise, the terrestrial antenna signal is processed in a terrestrial path 39 and provided to a respective input of combiner 37.

For purposes of controlling attenuator 30, a quality monitor 40 is coupled to demodulator 36 for measuring a quality parameter of the demodulated satellite signal, such as the signal-to-noise ratio (SNR) exhibited by the demodulated signal. The reception quality of either or both of the satellite signal paths can be monitored. In one preferred embodiment, the satellite radio receiver may include an S-DARS chip set manufactured by Agere Systems, Inc., known as the Sirius S-DARS chipset which includes the DSP-ARM processor known as the Agere CDAPT-SDC-IM-DB. The DSP-ARM processor provides SNR measured values over a signal bus in response to electronic requests (e.g., from a main microcontroller of the receiver). The SNR values generated by the chipset can be averaged over time periods specified in the requests.

Quality monitor 40 is coupled to a main controller and interface 41 which also receives input signals from AGC blocks 32 and 35. Based primarily on the SNR values from quality monitor 40 and secondarily on the gain values from AGC blocks 32 and 35, controller 41 sets an appropriate attenuation value in attenuator 30.

Figure 4:
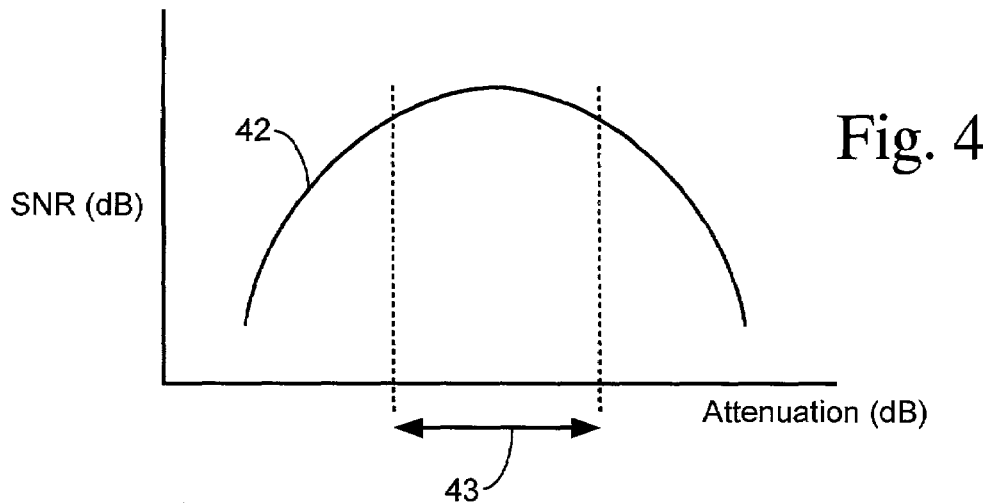
FIG. 4 is a plot of signal-to-noise ratio of a demodulated satellite signal versus added front-end attenuation when under RF signal conditions in which a strong, undesired signal tends to saturate the RF amplifier.

In particular, the present invention takes advantage of the SNR versus attenuation characteristic 42 shown in FIG. 4 whenever a strong interfering RF signal is present. At lower attenuation levels, the power level of the interfering signal reaching the RF front-end circuitry causes nonlinear operation (i.e., saturation). This results in intermodulation distortion which decreases the SNR of the demodulated signal. By increasing attenuation, the SNR of the demodulated signal improves because the nonlinear operation of the RF amplification is reduced. The SNR reaches a peak and then declines with increasing attenuation as the remaining power level of the desired satellite signal becomes weaker. Thus, the present invention controls the attenuation level to maintain the SNR in a region of optimal attenuation 43.

Figure 5:
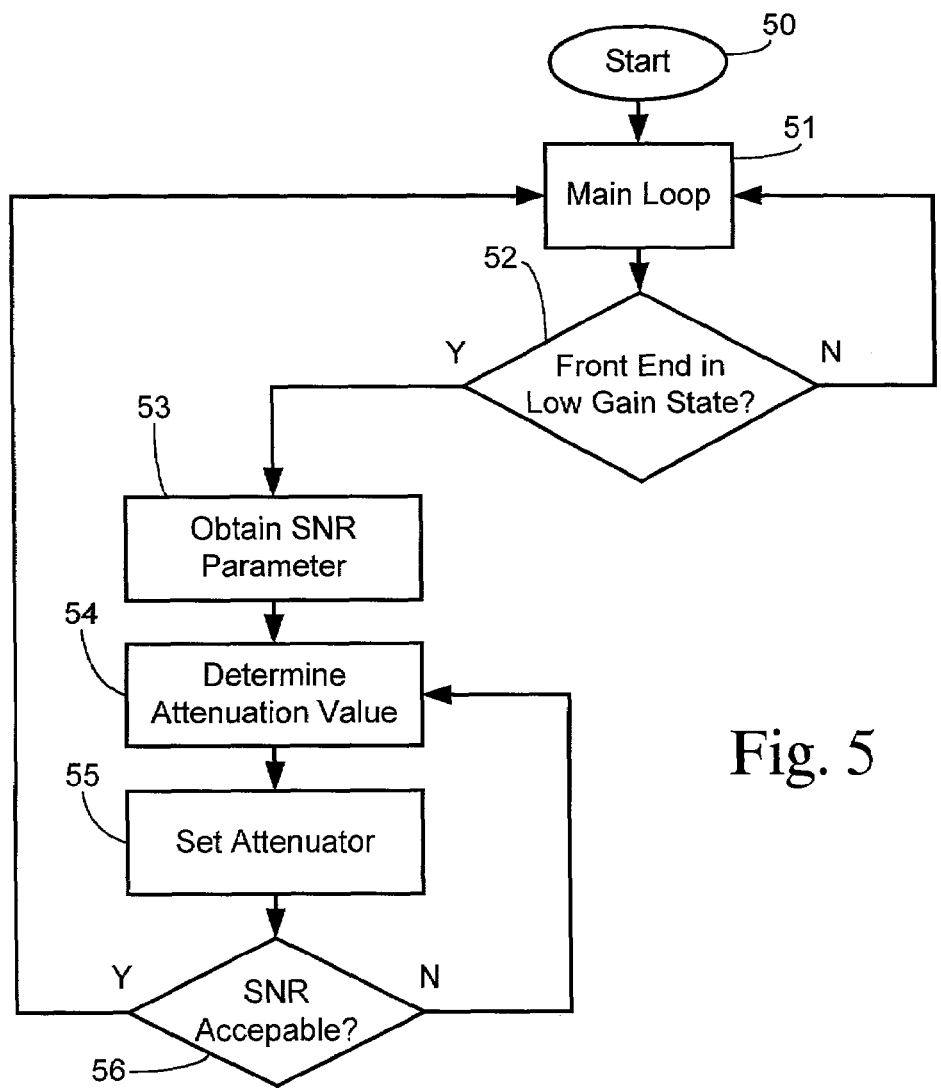
FIG. 5 is a flowchart of a method of the present invention.

A general method for controlling attenuation in response to SNR is shown in FIG. 5. From starting point 50, a main loop of an overall control algorithm is entered at step 51, from which an attenuator subroutine is periodically entered. In step 52, a check is made to determine whether the RF gain is in a low gain state. For example, the RF gain can be forced into its lowest gain state by a baseband decoding controller when the received signal power is high. The RF gain state is an indication of the total signal power within the passband of the RF amplifier, including both the desired and undesired signals. If the received signal power is high enough to cause the RF amplifier to go into its lowest AGC gain, then it is assumed that an interfering signal may be present. Thus, if the RF front end is not in a low gain state, then a return is made to main loop 51.

If a low gain state is detected in step 52, then an SNR parameter of the demodulated satellite signal is obtained in step 53. The SNR value is preferably a numeric value but is not necessarily an absolute SNR value (e.g., the SNR value may vary between 0x00 and 0xff for computational purposes on an arbitrary scale within the receiver). In step 54, an attenuation value corresponding to the SNR parameter is determined (e.g., based on a look-up table). The attenuation value is set in the attenuator in step 55 based on the voltage control characteristic of the attenuator.

The SNR value is re-determined in step 56 and is checked for an acceptable level. If not acceptable, then a new attenuation value is obtained in step 54. If acceptable, then a return is made to main loop 51.

Figure 6:
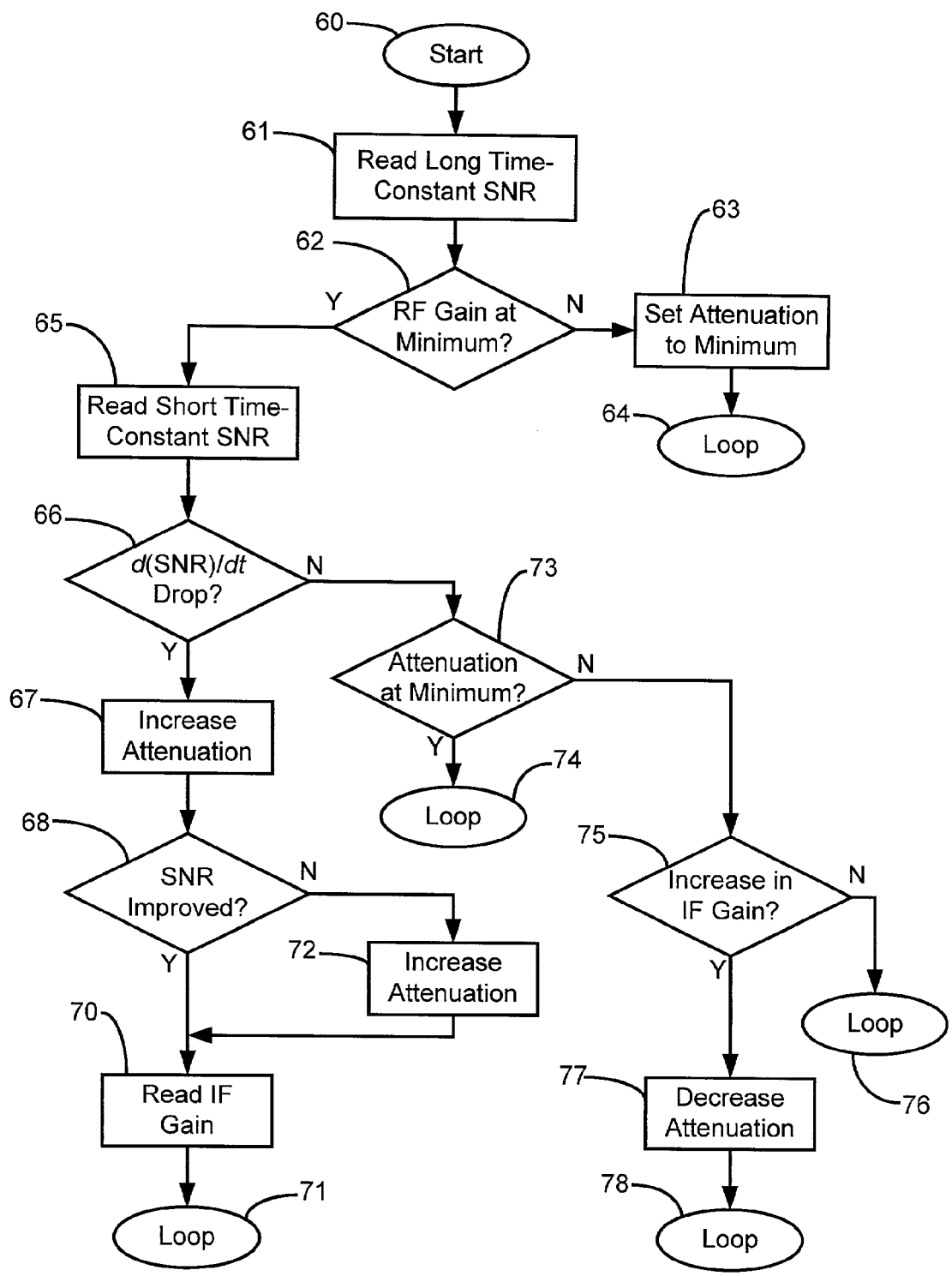
FIG. 6 is a flowchart showing a preferred embodiment in greater detail.

A more detailed method wherein attenuation is changed in predetermined steps in order to control satellite SNR is shown in FIG. 6. Following a start 60, a long time-constant SNR value is read in step 61. For example, the Agere chipset mentioned above responds to requests for SNR measurements averaged over a period of time as specified in a request. A long time-constant SNR value represents a historical SNR performance under the reception conditions of up to several seconds and provides a statistical prediction of expected SNR performance. As an alternative to queries to the chipset for SNR values having a long time constant, the controller of the present invention can request instantaneous SNR values (e.g., 1 millisecond averaging or less) and perform the long term averaging within the controller itself.

A check is made in step 62 to determine whether RF gain is at a minimum. For example, RF gain may have a number of discrete gain settings, such as low, medium, and high. If RF gain uses a continuous or more finely graded control, then a range of gain at the lower end may be employed. If RF gain is not at the minimum, then action to address an interfering signal is not necessary. Thus, attenuation is set to its minimum value in step 63 and a return to the main loop is made at step 64.

If the check in step 62 determines that RF gain is at the minimum, then a short time-constant SNR value is read in step 65. The short time constant may preferably be about one or two orders of magnitude less than the long time constant, so that the short time-constant SNR value provides an estimate of the instantaneous SNR. In step 66, a check is made to determine whether the instantaneous SNR shows a predetermined drop in SNR. For example, the two SNR values are used to obtain a time derivative d(SNR)/dt by dividing the difference in SNR values by the time of the short time constant and then the value of the derivative may be compared to a predetermined slope.

If the predetermined drop in SNR is detected, then attenuation is increased by a predetermined step size in step 67. If the SNR/attenuation characteristic is on the left half of the curve in FIG. 4, then SNR improves with the increased attenuation, otherwise SNR may decrease. Thus, the instantaneous SNR is re-checked in step 68 and compared with the previous short time-constant SNR value. If SNR did not improve, then the attenuation is decreased by the predetermined step size in step 72 (i.e., the previous attenuation value is restored).

Following the adjustment of the attenuation, the IF amplifier gain for the satellite signal path is read in step 70 and a return is made to the main loop in step 71. The IF gain value that is read in step 70 provides a reference during the adverse signal conditions so that an improving signal condition can be detected later.

If the check in step 66 determines that there has not been a predetermined drop in SNR, then a check is made in step 73 to determine whether attenuation is already at the minimum. If it is, then a return is made to the main loop in step 74. If attenuation is not at minimum, then the instantaneous IF gain value is determined and checked in step 75 against the value it had at step 70. If the IF gain has not increased, then the strong interfering signal is still present and a return is made to the main loop in step 76 without changing the attenuation value. If IF gain has increased, then the interfering signal has reduced in strength. Therefore, the attenuation is decreased by the predetermined step size in step 77 and a return is made to the main loop in step 78.

Figure 7:
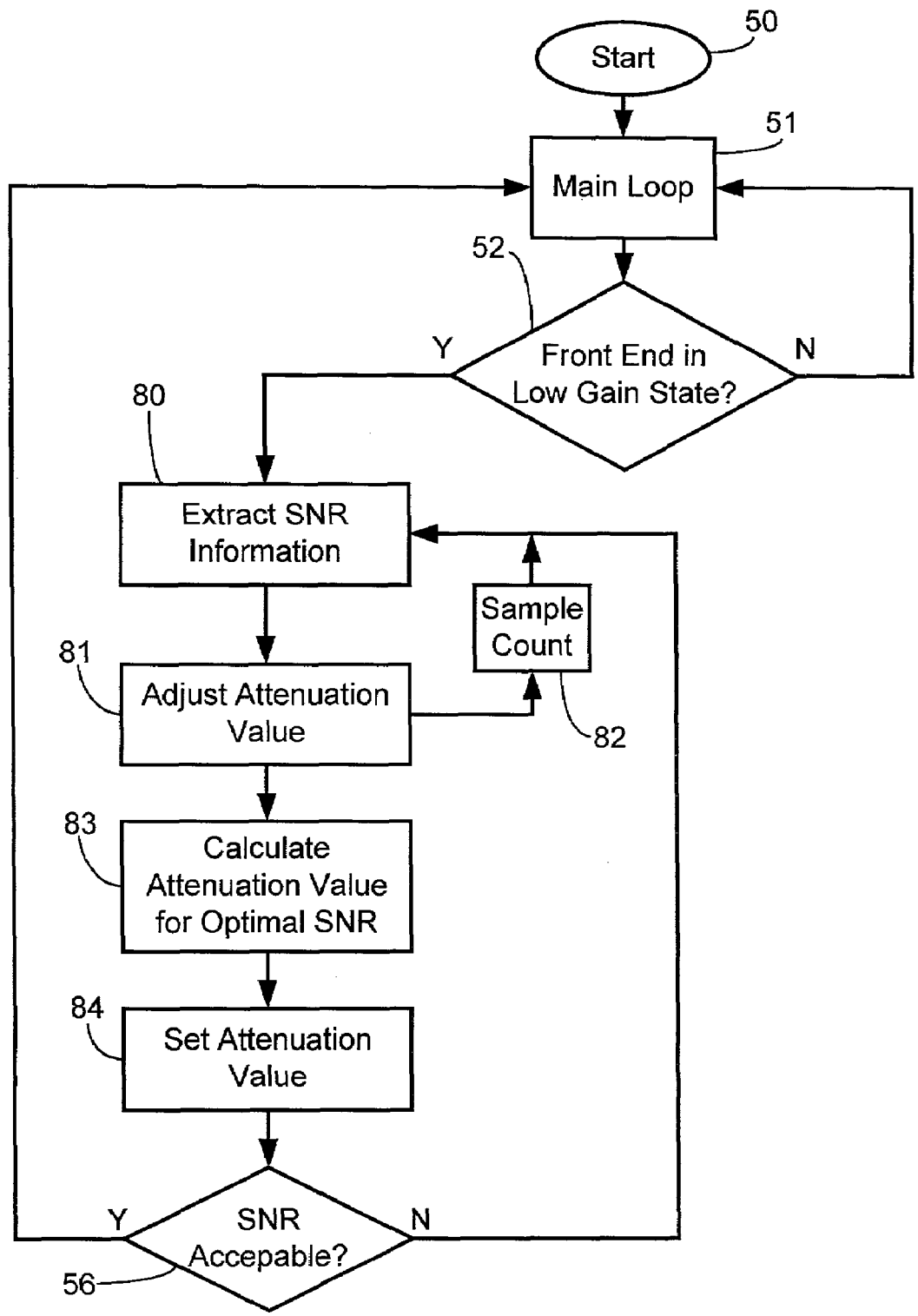
FIG. 7 is a flowchart of an alternative method of the present invention.
Figure 8:
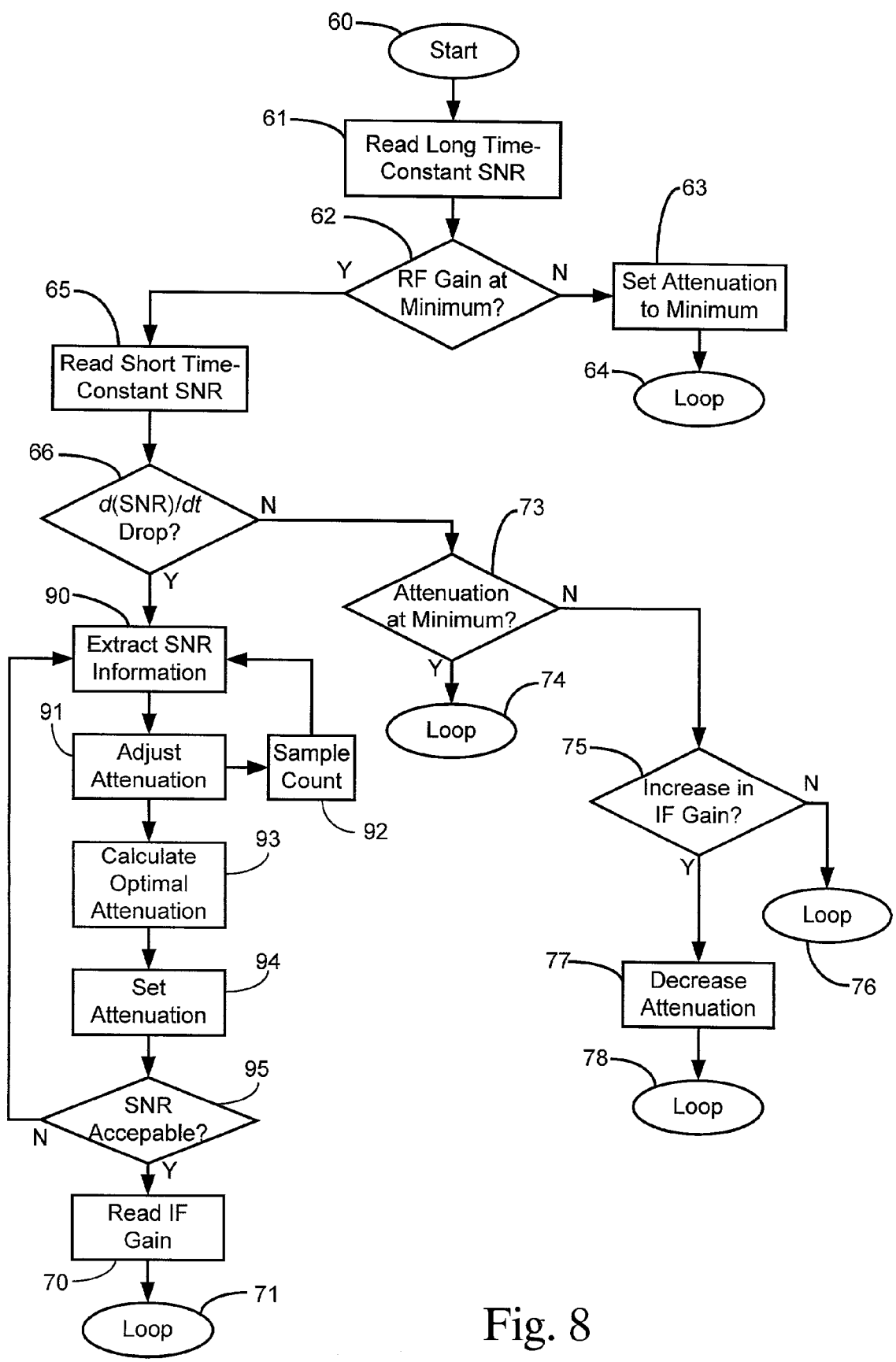
FIG. 8 is a flowchart showing a most preferred embodiment in greater detail.

FIGS. 7 and 8 illustrate further embodiments of the invention wherein the controller constructs an estimate of the characteristic curve of SNR versus attenuation as shown in FIG. 4 in view of the RF conditions existing at a particular time so that an optimal attenuation can be identified.

In FIG. 7, when step 52 identifies that the front end is in the low gain state, then an alternate embodiment of determining an attenuation value proceeds as follows. SNR information (e.g., an instantaneous or very short term average value) is extracted from the S-DARS chipset in step 80 using an initial attenuation value. For a predetermined number of sampling iterations, the attenuation value is adjusted in step 81. Based on a sample count 82, a return is made to step 80 to resample the SNR information. For example, a predetermined set of attenuation values may be obtained from a lookup table or may be dynamically determined based on how the SNR changes as the attenuation value is adjusted.

After the predetermined number of sampling iterations have been conducted, a series of data points of SNR versus attenuation have been obtained to which a curve can be fit in step 83 in order to estimate the characteristic of FIG. 4. Using the estimated curve, an attenuation value for optimizing the SNR is calculated (i.e., the attenuation level corresponding to the highest possible SNR value). Then the attenuator is set to this calculated attenuation value in step 84. Step 56 checks whether the SNR is acceptable (e.g., whether the value of d(SNR)/dt is above or below a predetermined threshold) and returns to step 80 if the SNR is not acceptable.

These same modifications are included in steps 90–95 of a further embodiment as shown in FIG. 8, such that an appropriate amount of attenuation can be quickly and accurately determined.

As a result of the foregoing method, satellite reception in the presence of strong interfering signals is greatly improved. Reception of the desired signal is maintained over a wider variety of conditions than with previous systems that controlled attenuation based on RF signal level. Furthermore, a typical receiver already has a capability of measuring signal-to-noise ratios, so that no additional components are required to implement the present invention.

What is claimed is:

1. A method of preventing saturation of an RF front end in a radio receiver when receiving a desired radio broadcast signal via an antenna in the presence of an undesired radio broadcast signal within a passband of said RF amplifier, said method comprising the steps of:

coupling an antenna signal from said antenna to said RF front end, thereby generating an amplified signal;

operating said radio receiver to demodulate said desired radio broadcast signal in response to said amplified signal, thereby generating a demodulated signal;

determining a signal-to-noise quality parameter of said demodulated signal; and adaptively adjusting an attenuation of said antenna signal prior to said RF front end by an attenuation determined in response to said signal-to-noise quality parameter for substantially maximizing said signal-to-noise quality parameter wherein said step of adaptively adjusting said attenuation comprises the steps of:

iteratively adjusting said attenuation and determining said signal-to-noise quality parameter at each adjusted attenuation to determine a plurality of data points;

estimating a characteristic of said signal-to-noise quality parameter versus said attenuation in response to said data points; and setting said attenuation to a value within said characteristic substantially maximizing said signal-to-noise quality parameter.

2. The method of claim 1 wherein said adaptive adjustment is made in response to detection of a predetermined drop in said signal-to-noise quality parameter, wherein said radio receiver includes an intermediate frequency (IF) amplifier having an automatically-controlled IF gain, and wherein if said predetermined drop is not detected then said method further comprises the steps of:

checking whether said IF gain is increasing; and decreasing said attenuation if said IF gain is increasing.

3. The method of claim 1 wherein said RF front end has a variable gain which is controlled between a minimum gain and a maximum gain, and wherein said adaptive adjustment is made when said variable gain is substantially equal to said minimum gain.

4. The method of claim 3 wherein said attenuation is set to a minimum attenuation when said variable gain is not substantially equal to said minimum gain.

5. A method of controlling attenuation of a satellite signal in a satellite signal path of a satellite radio receiver in a satellite radio system having satellite and terrestrial transmitters, wherein said satellite signal path includes an attenuator and a variable gain RF amplifier, said attenuator providing an attenuation of said satellite signal between a minimum attenuation and a maximum attenuation, said variable gain of said RF amplifier being automatically controlled between a minimum gain and a maximum gain, said method comprising the steps of:

demodulating a satellite signal received in said satellite signal path;

determining a first average signal-to-noise (SNR) value of said demodulated satellite signal in response to a first time constant;

if said variable gain is not substantially equal to said minimum gain, then setting said attenuation to said minimum attenuation;

if said variable gain is substantially equal to said minimum gain, then:

determining a second average SNR value of said demodulated satellite signal in response to a second time constant shorter than said first time constant;

comparing said first and second SNR values and if said second SNR value indicates at least a predetermined drop then increasing said attenuation by a predetermined step;

determining a third average SNR value of said demodulated satellite signal;

comparing said second and third SNR values and if said third SNR value indicates less than a predetermined increase of SNR then decreasing said attenuation.

6. The method of claim 5 wherein said radio receiver includes an intermediate frequency (IF) amplifier having an automatically-controlled IF gain, and wherein if said comparison of said first and second SNR values does not indicate said predetermined drop, then:

checking whether said IF gain increased since the last time that said attenuation was adjusted; and decreasing said attenuation if said IF gain increased.

7. A radio receiver comprising:

a satellite antenna providing a satellite antenna signal;

a terrestrial antenna providing a terrestrial antenna signal;

an attenuator for receiving said satellite antenna signal and generating an attenuated satellite signal, said attenuator having a variable attenuation between a minimum attenuation and a maximum attenuation in response to a control signal;

an RF front end for receiving said attenuated satellite signal and generating an RF output signal, said RF front end having a variable gain between a minimum gain and a maximum gain;

an intermediate frequency (IF) stage for receiving said RF output signal and generating an IF output signal;

a detector for demodulating said IF output signal to generate a demodulated signal which recovers information from said satellite antenna signal, said detector including a quality monitor for determining a signal-to-noise parameter of said demodulated signal; and
a controller for generating said control signal in response to said signal-to-noise parameter, said controller adaptively adjusting said attenuation to substantially maximize said signal-to-noise quality parameter;
wherein said quality monitor determines a first average signal-to-noise (SNR) value of said demodulated signal in response to a first time constant and determines a second average SNR value of said demodulated signal in response to a second time constant shorter than said first time constant, and wherein said controller adaptively adjusts said attenuation in response to detection of a predetermined drop in response to said first SNR value to said second SNR value.

8. The radio receiver of claim 7 wherein said controller iteratively adjusts said attenuation and determines said signal-to-noise quality parameter at each adjusted attenuation to determine a plurality of data points, estimates a characteristic of said signal-to-noise quality parameter versus said attenuation in response to said data points, and sets said attenuation to a value within said characteristic substantially maximizing said signal-to-noise quality parameter.

9. The radio receiver of claim 7 wherein said controller increases said attenuation, checks whether said signal-to-noise quality parameter improved, and decreases said attenuation if said signal-to-noise quality parameter did not improve.

10. The radio receiver of claim 7 wherein said controller adaptively adjusts said attenuation when said variable gain is substantially equal to said minimum gain and sets said attenuation to said minimum attenuation when said variable gain is not substantially equal to said minimum gain.

11. The radio receiver of claim 7 wherein said IF stage includes an IF amplifier having an automatically-controlled IF gain, and wherein if said predetermined drop is not detected then said controller decreases said attenuation if said IF gain is increasing.

12. A radio receiver for controlling attenuation of a satellite signal in a satellite signal path of a satellite radio receiver in a satellite radio system having satellite and terrestrial transmitters, the receiver comprising:

an attenuator providing an attenuation of said satellite signal between a minimum attenuation and a maximum attenuation;
an RF amplifier providing a variable gain being automatically controlled between a minimum gain and a maximum gain, said method comprising the steps of:
a demodulator for demodulating a satellite signal received in said satellite signal path;
a quality monitor for determining a first average signal-to-noise (SNR) value of said demodulated satellite signal in response to a first time constant;
a controller for setting said attenuation to said minimum attenuation if said variable gain is not substantially equal to said minimum gain;
wherein if said variable gain is substantially equal to said minimum gain, then:
said quality monitor determines a second average SNR value of said demodulated satellite signal in response to a second time constant shorter than said first time constant;
said controller compares said first and second SNR values and if said second SNR value indicates at least a predetermined drop then increasing said attenuation by a predetermined step;
said quality monitor determines a third average SNR value of said demodulated satellite signal;
said controller compares said second and third SNR values and if said third SNR value indicates less than a predetermined increase of SNR then decreasing said attenuation.

13. The radio receiver of claim 12 wherein said radio receiver includes an intermediate frequency (IF) amplifier having an automatically-controlled IF gain, and wherein if said comparison of said first and second SNR values does not indicate said predetermined drop, then checking whether said IF gain increased since the last time that said attenuation was adjusted and decreasing said attenuation if said IF gain increased.

* * * * *